United States Patent [19]
Wiemann et al.

[11] Patent Number: 5,247,133
[45] Date of Patent: Sep. 21, 1993

[54] HIGH-VACUUM SUBSTRATE ENCLOSURE

[75] Inventors: David A. Wiemann, Mesa; James E. Jaskie, Scottsdale; John Summers, Apache Junction, all of Ariz.; Robert C. Kane, Woodstock, Ill.

[73] Assignee: Motorola, Inc., Schaumburg, Ill.

[21] Appl. No.: 751,854

[22] Filed: Aug. 29, 1991

[51] Int. Cl.⁵ ............................................ H01L 23/02
[52] U.S. Cl. .................................. 174/17 R; 174/52.4
[58] Field of Search ............ 174/17 R, 17 VA, 17.05, 174/17.08, 50.5, 50.54, 52.3, 52.4, 52.5

[56] References Cited

U.S. PATENT DOCUMENTS

| | | | |
|---|---|---|---|
| 2,577,576 | 12/1951 | Glickman et al. | 174/52.3 X |
| 3,762,039 | 10/1973 | Douglass et al. | 174/52.3 X |
| 4,326,214 | 4/1982 | Trueblood | 174/52.3 X |
| 4,780,572 | 10/1988 | Kondo et al. | 174/52.4 |
| 4,897,508 | 1/1990 | Mahuliker et al. | 174/52.4 |
| 5,013,871 | 5/1991 | Mahuliker et al. | 174/52.4 |
| 5,023,398 | 6/1991 | Mahuliker et al. | 174/52.4 |

Primary Examiner—Leo P. Picard
Assistant Examiner—David A. Tone
Attorney, Agent, or Firm—Eugene A. Parsons

[57] ABSTRACT

An enclosure providing an evacuated region about an array of microelectronic vacuum devices including a substrate, a first encapsulation member defining a cavity, a second encapsulation member defining a cavity and mating with the first encapsulation member so as to define an encapsulated region, a ledge formed in the first encapsulation member for supporting the substrate and defining a communicating passage between the cavities and a sealing agent disposed between the mating surfaces of the encapsulation members to effect a vacuum seal such that when the encapsulated region is evacuated it will be at the same vacuum levels throughout to eliminate differential pressure induced deformation of the substrate. The evacuated substrate enclosure further provides for assembly without an evacuated environment.

41 Claims, 7 Drawing Sheets

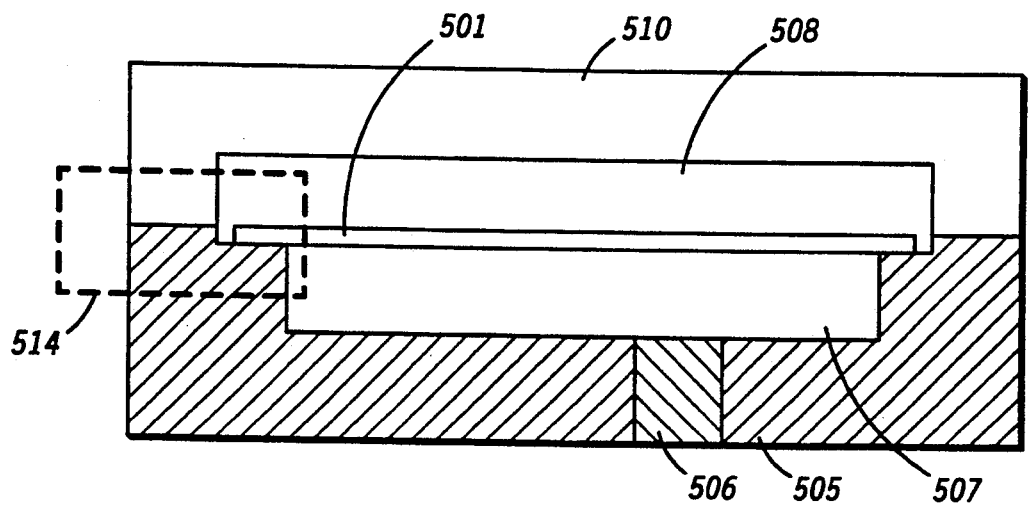
FIG. 5A
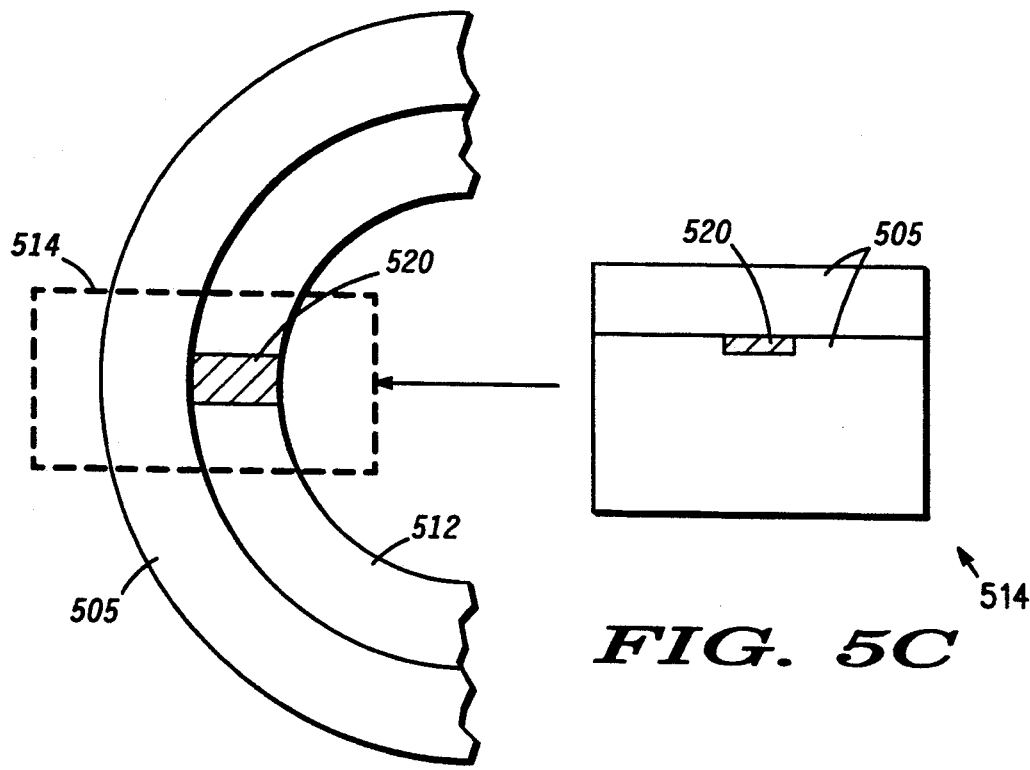
FIG. 5B
FIG. 5C

HIGH-VACUUM SUBSTRATE ENCLOSURE

FIELD OF THE INVENTION

The present invention relates generally to high-vacuum enclosures and more particularly to methods and structures which provide high-vacuum enclosures.

BACKGROUND OF THE INVENTION

The need to provide a vacuum environment for operation of electronic components and devices is well documented in the art. For example, vacuum tube devices operate, of necessity, in a vacuum environment which is realized by employing an evacuated and sealed glass envelope in which the active device is disposed.

Presently, research activity is focusing on methods to implement vacuum device technology employing microelectronic structures. These structures, in many instances, are comprised of arrays of individual devices disposed on a suitable supporting substrate. One particular application of a microelectronic vacuum device structure is as a flat image display.

A number of undesirable features of present technology make the implementation of flat displays employing microelectronic vacuum devices difficult to realize. Prior art methods of effecting a seal about the encapsulating structure, which may be a display faceplate, to the substrate on which the microelectronic vacuum devices are disposed is generally a process which requires high temperatures. During cool-down objectionably large bulk stresses are created in the structure which induce failure during device operation.

Further, prior art methods of providing an evacuated region for device operation result in significant deformation of the substrate as a result of the large differential pressure between the evacuated region and the external environment. One prior art method employed to overcome the objectionable deformation of the substrate is described by Brodie (U.S. Pat. No. 4,923,421) wherein a method for providing polyimide spacers in a field emission panel display is described. This prior art technique requires incorporation of an array of spacers as part of the overall structure which introduces an objectionable complexity to device fabrication.

Additionally, prior art methods, including those described above and others require that display device assemblies in particular and microelectronic vacuum device assemblies in general be assembled within an evacuated environment.

In prior art applications the vacuum requirements imposed on the device structure precludes the possibility that many known sealing materials may be used since these sealing materials are known to out-gas when disposed in a vacuum environment on the order of $1 \times 10^{-5}$ Torr. or less.

Accordingly there exists a need for an improved vacuum enclosure and method for providing an improved vacuum enclosure which overcomes at least some of the shortcomings of the prior art.

SUMMARY OF THE INVENTION

This need and others are substantially met by provision of an evacuated substrate enclosure including a substrate, a first encapsulation member defining a cavity with a generally circumferentially mating surface extending therearound, a second encapsulation member defining a cavity with a generally circumferentially mating surface extending therearound and proximally disposed with respect to the mating surface of the first encapsulation member so as to define an encapsulated region between the first and second encapsulation members, structure, within one of the first and second encapsulation members, receiving the substrate and fixedly supporting the substrate and defining a communicating passage between the cavities of the first and second encapsulation members within the encapsulated region, and a sealing agent disposed between the mating surfaces of the first and second encapsulation members to effect a vacuum seal such that when the encapsulated region is evacuated it will be at substantially the same vacuum levels throughout to substantially eliminate differential pressure induced deformation of the substrate.

Alternatively the substrate is formed with an aperture therethrough to equalize pressure throughout the encapsulated area. The evacuated substrate enclosure further provides an external evacuating access aperture for assembly without an evacuated environment.

BRIEF DESCRIPTION OF THE DRAWINGS

FIGS. 5A-C depict various views and partial views of another embodiment of an evacuated substrate enclosure in accordance with the present invention.

DETAILED DESCRIPTION OF PREFERRED EMBODIMENTS

Figure 1A:
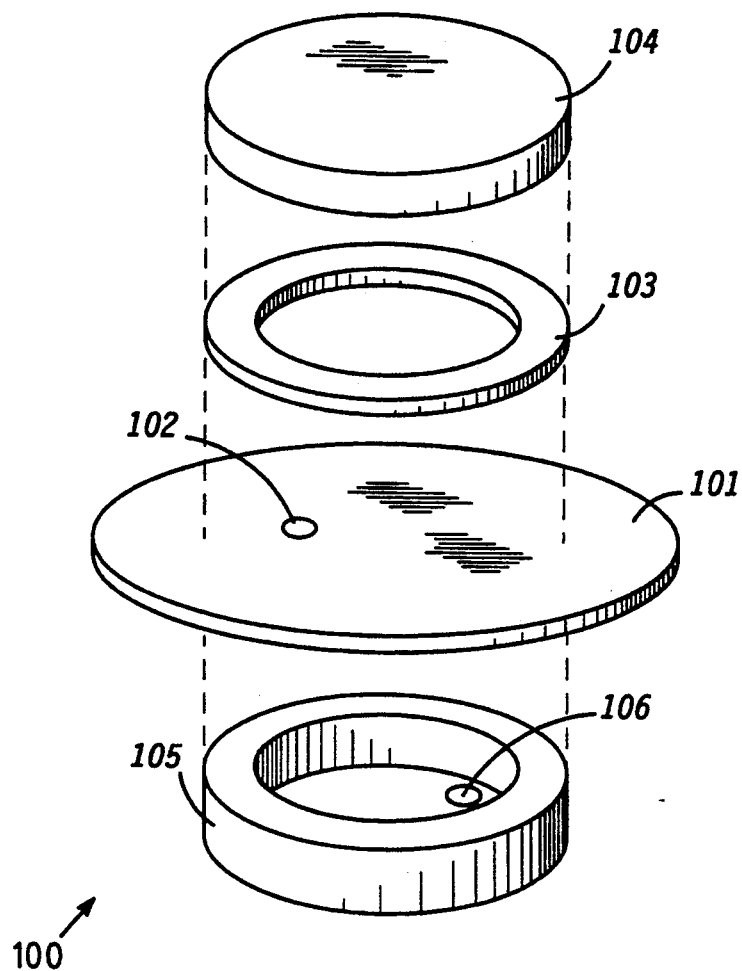
FIG. 1A is an expanded perspective view of an embodiment of an evacuated substrate enclosure in accordance with the present invention.

Referring now to FIG. 1A there is depicted an expanded view in perspective of a structure 100 which comprises a first embodiment of an evacuated substrate enclosure in accordance with the present invention. A substrate 101, having first and second major surfaces, on which an array of microelectronic devices (not shown), as are commonly known in the art, may be disposed includes an aperture 102 which extends through the thickness of substrate 101 from major surface to major surface. A ring shaped sidewall 103, having first and second substantially parallel surfaces, is disposed in the region between substrate 101 and an encapsulation plate 104. Sidewall 103 and encapsulation plate 104 cooperate to form a first generally cup-shaped encapsulation member. A second generally cup-shaped encapsulation member 105 defines an aperture 106 which extends through the thickness thereof from surface to surface. Encapsulation member 105 further includes an integrally formed sidewall extending around the periphery thereof.

Figure 1B:
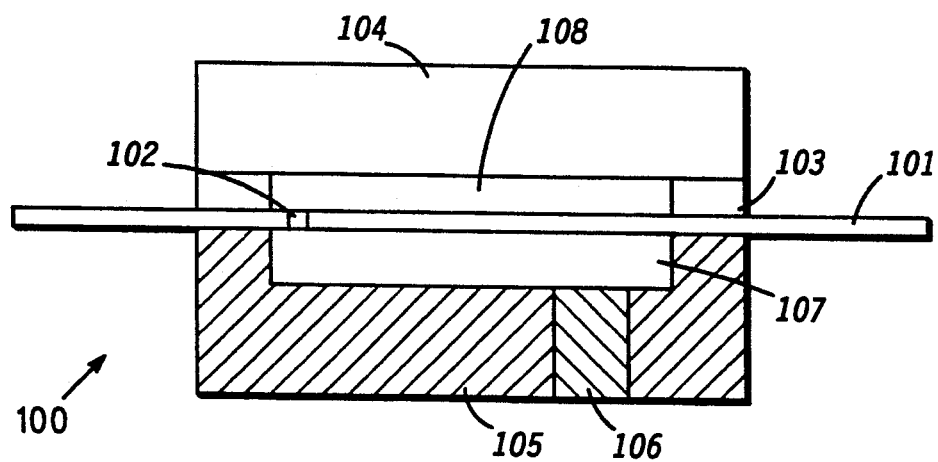
FIG. 1B is side-elevational cross-sectional depiction of the evacuated substrate enclosure of FIG. 1A.

FIG. 1B depicts a side-elevational cross-sectional view of structure 100 wherein the component parts are positioned proximal to each other and separated only by a sealing agent (not shown), to be described and depicted below, in a manner which forms encapsulated regions 107 and 108 on either side of substrate 101, respectively. Encapsulated region 108 is defined by plate 104, sidewall 103, and the upper (in FIG. 1B) surface of substrate 101. Encapsulated region 107 is defined by the lower surface (in FIG. 1B) of substrate 101 and encapsulation member 105. With apertures 102 and 106 disposed as depicted in FIG. 1B and with the attendant sealing agent (not shown) disposed at the interface between each of the component parts of structure 100 an encapsulated structure is formed which may be evacuated by pumping gaseous constituents from the enclosure so formed. Encapsulated region 108 is substantially evacuated by pumping gaseous constituents out through aperture 102 into encapsulated region 107. Encapsulated region 107 is substantially evacuated by pumping gaseous constituents out through aperture 106. Aperture 102, in addition to providing a means through which encapsulated region 108 is evacuated, also provides a means by which equal vacuum levels are realized on both sides of substrate 101. As such no differential pressure induced substrate deformations will be encountered.

Figure 2:
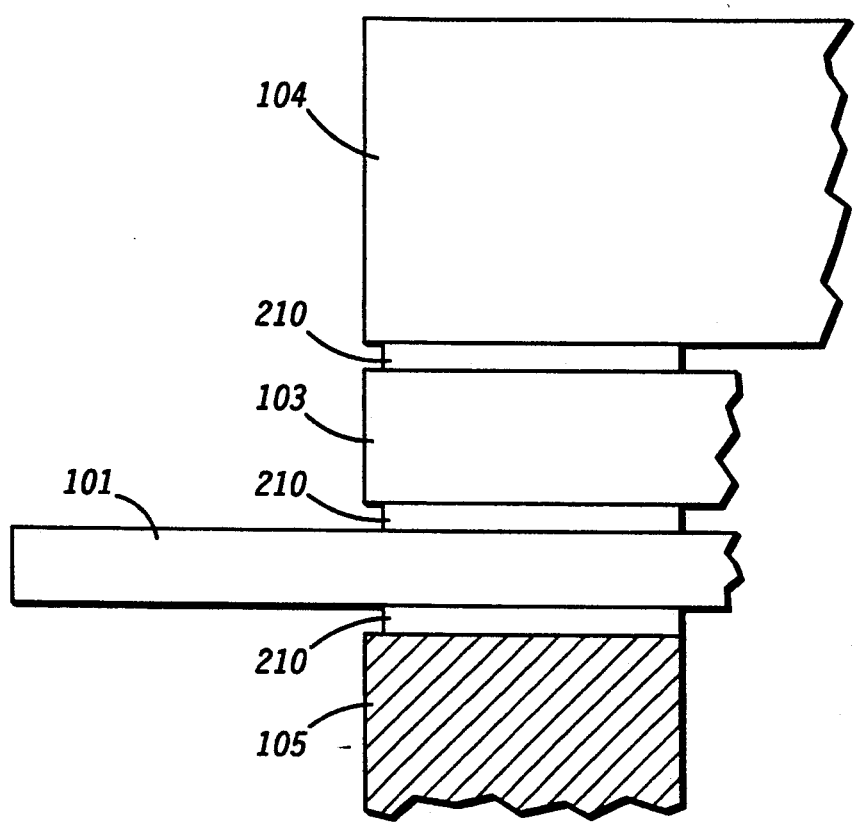
FIG. 2 is an enlarged cross-sectional view of a portion of the evacuated substrate enclosure of FIG. 1A.

FIG. 2 is an enlarged partial side-elevational cross-sectional depiction of structure 100 depicting a sealing agent 210 disposed at the interface of each of the component parts of structure 100. In order to form a structure which may be successfully evacuated, sealing agent 210 is interposed between the proximal surfaces of each of encapsulation member 105 and substrate 101, substrate 101 and sidewall 103, and sidewall 103 and plate 104 to provide a vacuum seal at each interface. In the instance of the present disclosure sealing agent 210 is a low-temperature (room temperature) curable high-vacuum (pressures less than $1 \times 10^{-7}$ Torr.) compatible epoxy sealing material. Utilization of such a material eliminates the concern of built-in residual stresses as a result of elevated temperature sealing techniques which are employed in the prior art to realize high-vacuum seals.

Figure 3:
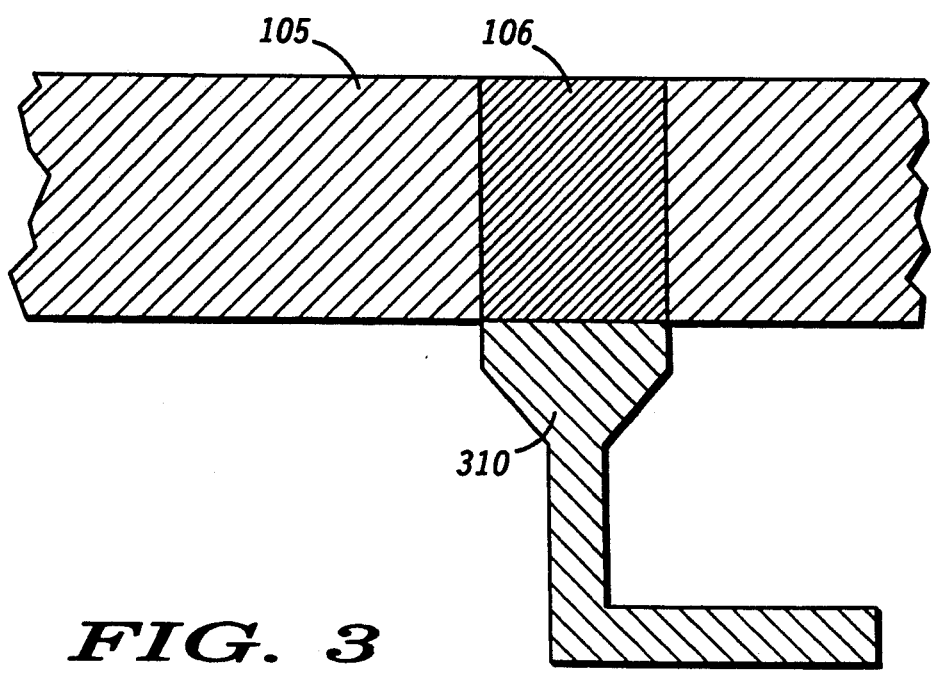
FIG. 3 is a partial side-elevational cross-sectional depiction of apparatus for evacuating an evacuated substrate enclosure in accordance with the present invention.

FIG. 3 depicts an enlarged side-elevational view of a portion of structure 100 including an evacuation tube 310 which has been operably connected to aperture 106 in encapsulation member 105 such that an externally provided vacuum pump (not shown) of any type commonly employed in the art may be utilized to evacuate encapsulated regions 107, 108 of structure 100. Subsequent to evacuation of the structure, evacuation tube 310 may be sealed by any of the known methods such as, for example, by pinching the tube closed so as to make the evacuation permanent. Alternatively evacuation tube 310 may remain attached to the externally provided vacuum pump to provide for continuous evacuation of encapsulated regions 107, 108.

Figure 4A:
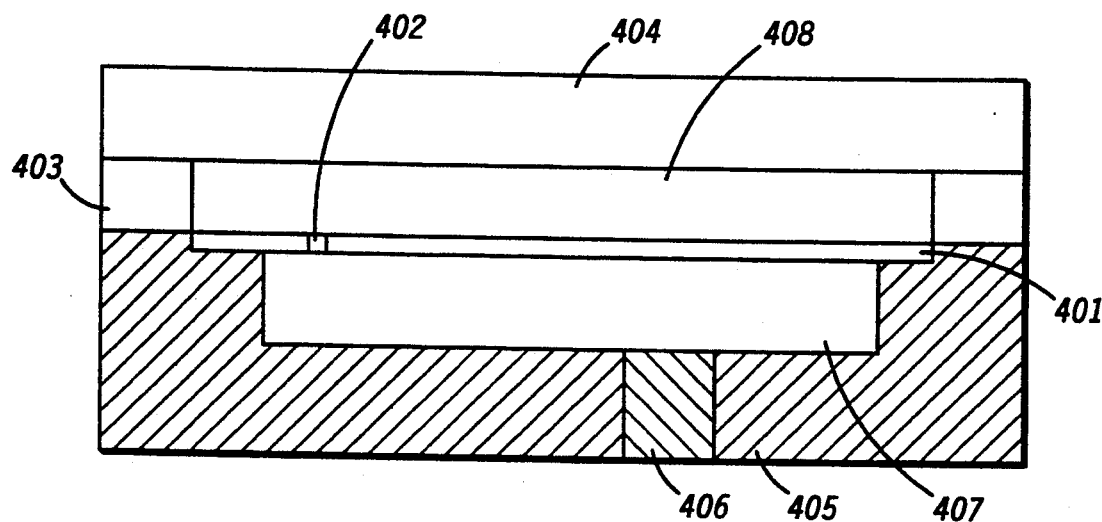
FIG. 4A is a side-elevational cross-sectional depiction of another embodiment of an evacuated substrate enclosure in accordance with the present invention.

FIG. 4A is a side-elevational cross-sectional depiction of another embodiment of an evacuated substrate enclosure 400 wherein reference designators corresponding to structural features depicted previously in FIGS. 1A & 1B are herein referenced beginning with the numeral "4". Enclosure 400 differs from structure 100 in that an encapsulation member 405 is formed with a radially inwardly directed ledge 412 on which substrate 401 is disposed. Further, encapsulation member 405 has a circumferentially extending supporting surface adapted to mate with one of the surfaces of sidewall 403. With encapsulation member 405 so formed, the entire substrate 401 is disposed within the encapsulation structure including encapsulation member 405, sidewall 403, and plate 404. As with structure 100, encapsulated regions 407, 408 are evacuated to the same pressure level due to the inclusion of aperture 402 which provides for a net zero differential pressure between encapsulated region 407 and encapsulated region 408.

Figure 4B:
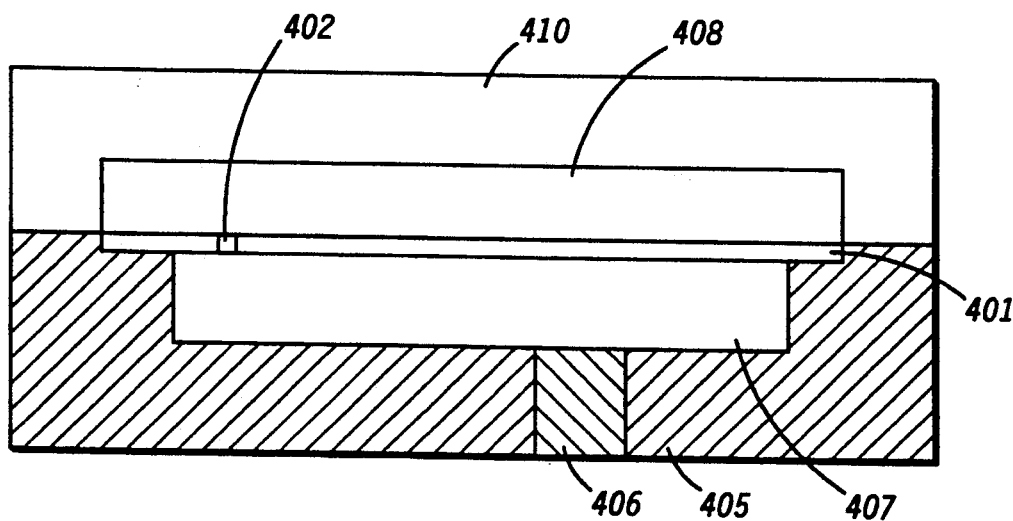
FIG. 4B is a side-elevational cross-sectional depiction of another embodiment of an evacuated substrate enclosure in accordance with the present invention.

Referring now to FIG. 4B a side-elevational cross-sectional view of another embodiment of an evacuated substrate enclosure 400' is depicted. Enclosure 400' is similar to enclosure 400 described previously with reference to FIG. 4A except that sidewall 403 and plate 404 are herein depicted as an integral component, encapsulation member 410. With encapsulation member 410 so formed, the need for a discrete sidewall is eliminated as is one of the interfaces which requires subsequent sealing. Encapsulation member 410 has a circumferentially extending surface that mates with the circumferentially extending surface of encapsulation member 405 to form an encapsulated region on either side of substrate 401.

FIG. 5A is a side-elevational cross-sectional depiction of another embodiment of an evacuated substrate enclosure 500 wherein reference designators corresponding to features similar to those depicted in FIG. 4B are similarly referenced beginning with the numeral "5". In enclosure 500 the aperture disposed in the substrate of the previous embodiments is not in evidence and may, if desired, be excluded from device realization. A region 514 representing a part of the structure, to be described below, includes an aperture through which encapsulated region 507 is pumped for evacuation.

Referring now to FIG. 5B, which is a view in top plan of encapsulation plate 505, region 514 corresponding to that part of the structure delineated by a dashed line box in FIG. 5A includes a communicating passage 520. Passage 520 is formed in encapsulation member 505 as a notch in ledge 512 on which substrate 501 is disposed.

FIG. 5C is a view of encapsulation member 505 as seen from the line 5C—5C in FIG. 5B depicting that passage 520 formed in ledge 512 is of finite extent and extends below ledge 512 on which substrate 501, depicted in FIG. 5A, is disposed. It will be understood that many other, or additional, communicating passages can be formed to extend around the periphery of the substrate so that the cavities on either side of substrate 501 are in communication and pressure is equalized throughout the encapsulated area.

With vacuum substrate enclosure 500 formed as described above, the need to provide an evacuation aperture in substrate 501 is eliminated by provision of aperture 520 in encapsulation member 505. With substrate 501 disposed as depicted in FIG. 5A and with the notch formed as shown in FIGS. 5B–5C, encapsulated regions 507 and 508 will assume the same vacuum level so as to provide for no net differential pressure therebetween.

As such, no differential pressure induced substrate deformations will be introduced in the structure.

Figure 6A:
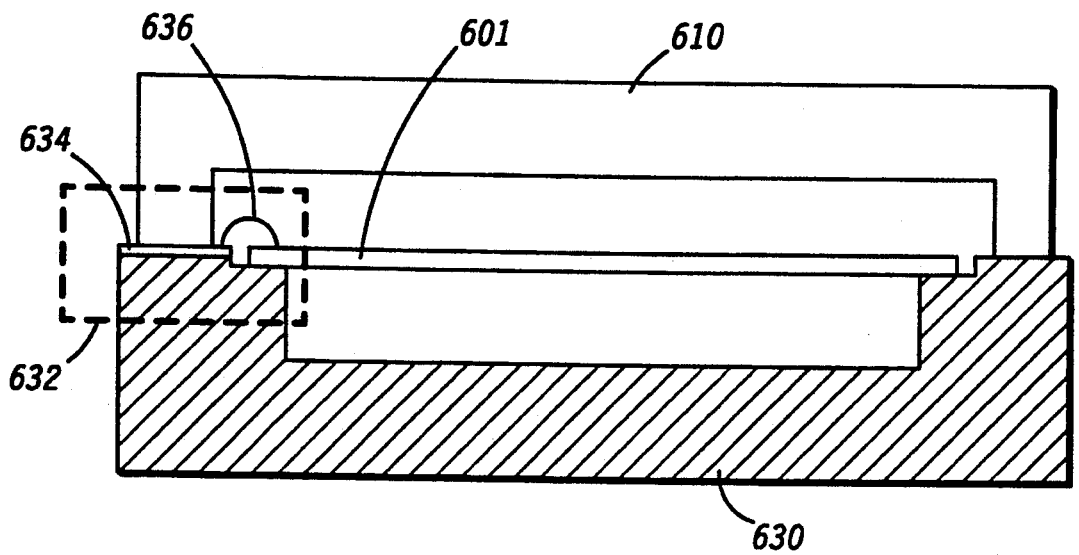
FIG. 6A is a side-elevational cross-sectional depiction of another embodiment of an evacuated substrate enclosure in accordance with the present invention.

FIG. 6A is a side-elevational cross-sectional depiction of another embodiment of an evacuated substrate enclosure 600 including a first cup-shaped encapsulation member 610, a second cup-shaped encapsulation member 630, and a substrate 601. FIG. 6A further depicts that encapsulation member 630 includes a radially inwardly directed ledge 612 on which substrate 601 is disposed. Encapsulation members 630 and 610 are designed with mating surfaces and define a central cavity when the mating surfaces are placed in abutting engagement, as illustrated in FIG. 6A. A region 632 delineated by a dashed line box includes electrically conductive paths 634 disposed on the mating surface of encapsulation member 630. Electrically conductive interconnects 636 are employed to electrically couple conductive paths 634 to conductive nodes which are disposed on substrate 601.

Figure 6B:
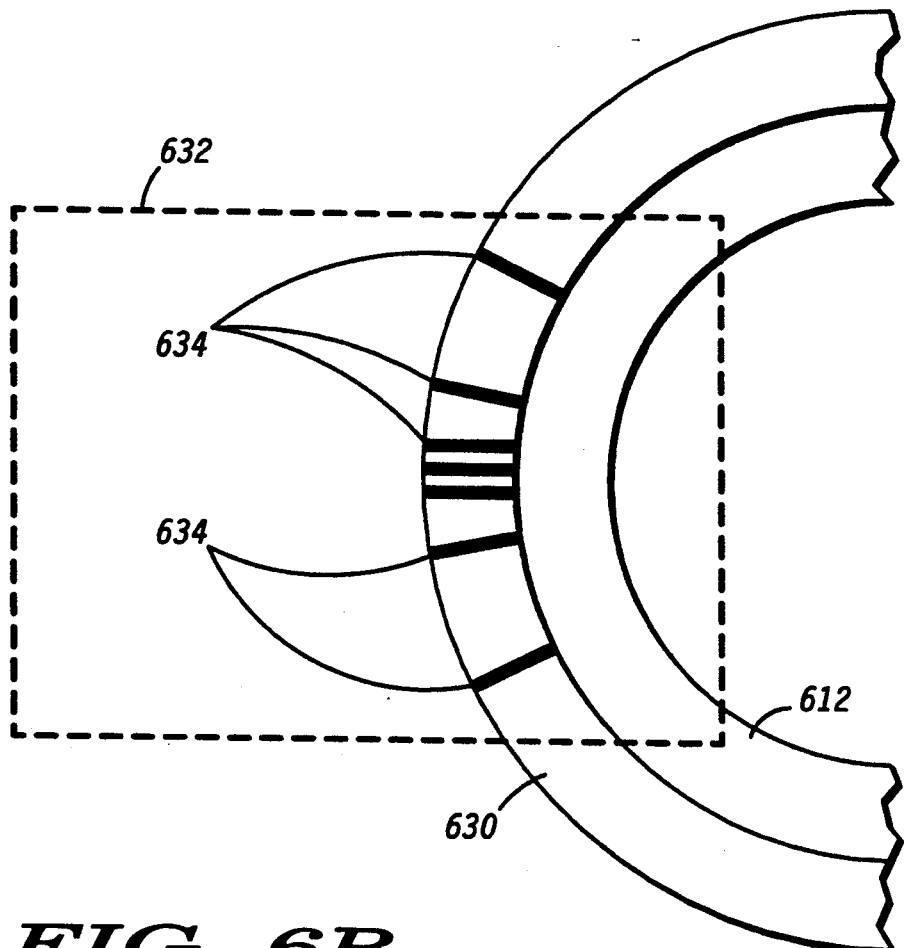
FIG. 6B is a partial top view of the evacuated substrate enclosure illustrated in FIG. 6A.

FIG. 6B is a partial top plan view of encapsulation member 630 further detailing region 632. Conductive paths 634 are shown disposed on the mating surface of encapsulation member 630 proximally disposed with respect to a surface of the upper encapsulation member 610 wherein the proximally disposed surfaces define an interface at which a sealing agent may be interposed to effect a vacuum seal. Conductive paths 634 are formed to traverse the extent of the vacuum seal so as to provide a means to operably couple the active devices which may be disposed on substrate 601 to externally provided circuitry.

It is anticipated that the structures both previously and subsequently described in this disclosure may utilize the method of FIGS. 6A-B to operably couple the devices which may be disposed on the substrate to externally provided circuitry.

Figure 7A:
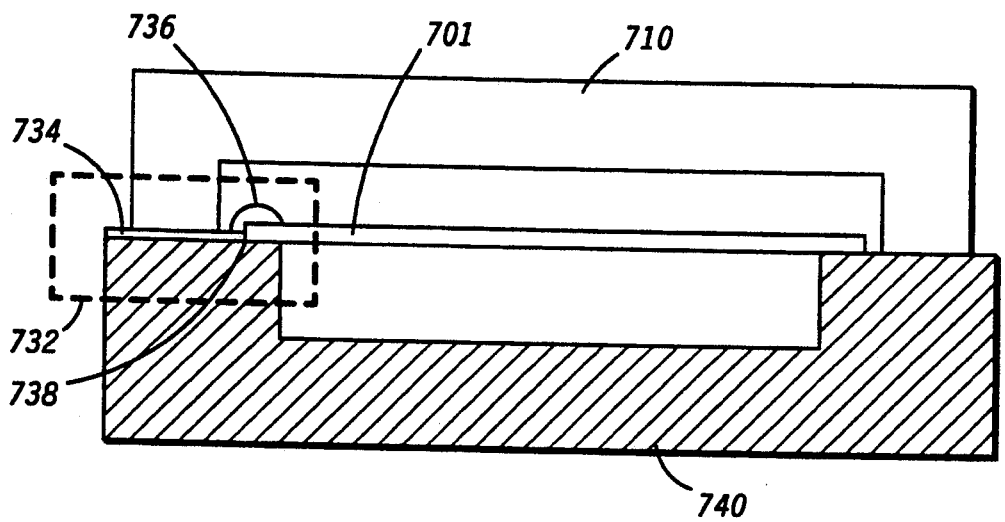
FIGS. 7A, 7B and 7C are side-elevational cross-sectional depictions of still further embodiments of an evacuated substrate enclosure in accordance with the present invention.

FIG. 7A is a side-elevational cross-sectional depiction of another embodiment of an evacuated substrate enclosure in accordance with the present invention including a first cup-shaped encapsulation member 740 having a mating surface 738, a substrate 701 and a second cup-shaped encapsulation member 710. Conductive paths 734, similar to that described previously with reference to FIGS. 6A & 6B are provided on surface 738 and extend from within the encapsulated region through the vacuum seal to a region outside the enclosure. In the present embodiment substrate 701 is depicted as disposed on a part of surface 738 on which conductive paths 734 are disposed and which surface 738 is proximally disposed to a mating surface of encapsulation member 710 to form an interface at which a sealing agent, described previously with reference to FIG. 2, is disposed. Electrically conductive interconnects 736 are provided to operably couple conductive paths 734 to conductive nodes which are disposed on substrate 701. So formed, the structure of FIG. 7A is assembled in an evacuated environment so as to provide for equal vacuum levels on both sides of substrate 701 and also provide for operable coupling, as desired, to externally provided circuitry.

Figure 7B:
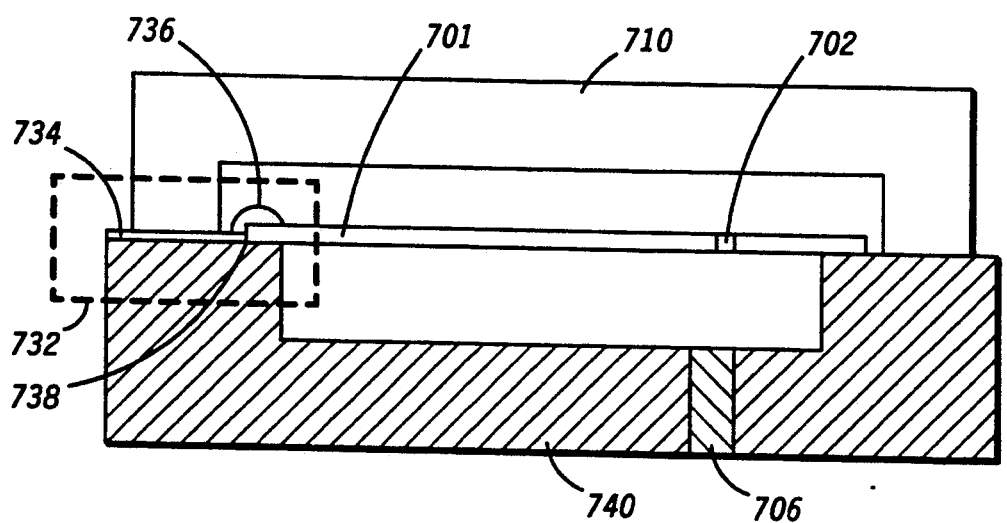

FIG. 7B is a side-elevational cross-sectional depiction of another embodiment of an evacuated substrate enclosure similar to that described previously with reference to FIG. 7A and further including an aperture 702 and an aperture 706, both described previously with reference to FIGS. 1A & 1B. So formed, the structure of FIG. 7B is assembled without an evacuated environment and is subsequently evacuated by an externally provided vacuum pump so as to provide for equal vacuum levels on both sides of substrate 701 and also provide for operable coupling, as desired, to externally provided circuitry.

Figure 7C:
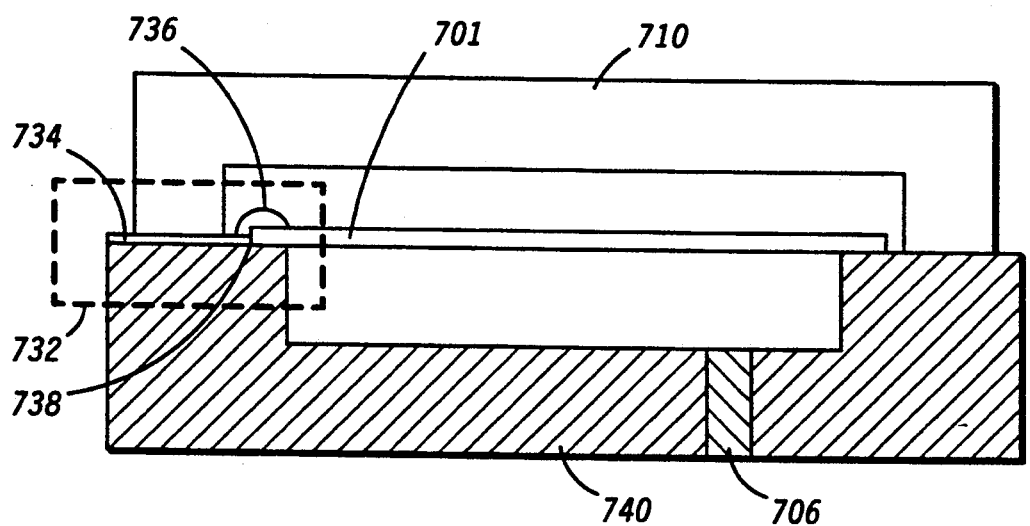

FIG. 7C is a side-elevational cross-sectional depiction of another embodiment of an evacuated substrate enclosure similar to that described previously with reference to FIG. 7A and including an aperture 706 as described previously with reference to FIGS. 1A & 1B and further including a notch 720 as described previously with reference to FIGS. 5A & 5B. So formed, the structure of FIG. 7C may be assembled without an evacuated environment and subsequently evacuated by an externally provided vacuum pump so as to provide for equal vacuum levels on both sides of substrate 701 and also provide for operable coupling, as desired, to externally provided circuitry.

It should be understood that in the embodiments disclosed one of the encapsulation plates or members may be formed of a substantially optically transparent material such as, for example, quartz in which instance the plate or member will be suitable for application as a display faceplate.

It is further anticipated that alternative embodiments which incorporate some of the features of any of the embodiments detailed herein may be realized and that, where appropriate, each of the features detailed in any one embodiment disclosed herein is anticipated to be applicable to any other embodiment. Further, while the disclosed embodiments are illustrated with a circular cross section it will be understood that virtually any desired cross section could be realized and terms such as radial and circumferential are not meant to limit the structure to circular.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. An evacuated substrate enclosure comprising:
   a substrate having first and second major surfaces and defining an aperture therebetween;
   a first encapsulation member having a surface proximally disposed with respect to one of the first and second surfaces of the substrate and defining an encapsulated region between the first encapsulation region and the substrate, the surface of the first encapsulation member and the substrate defining an interface therebetween;
   a second encapsulation member having a surface proximally disposed with respect to the other of the first and second surfaces of the substrate and defining an encapsulated region between the second encapsulation member and the substrate, the second encapsulation member having an aperture formed therethrough and the surface of the second encapsulation member and the substrate defining an interface therebetween; and
   a sealing agent disposed in the interfaces between the proximally disposed surface of the first encapsulation member and the substrate and the proximally disposed surface of the second encapsulation member and the substrate to effect a vacuum seal such that when evacuating the encapsulated regions so formed the encapsulated regions will be at substantially the same vacuum levels to provide for substantially no differential pressure induced deformation of the substrate.

2. The evacuated substrate enclosure of claim 1 wherein the sealing agent includes an epoxy material that provides a vacuum seal at vacuum pressures of less than $1 \times 10^{-7}$ Torr.

3. The evacuated substrate enclosure of claim 1 wherein the sealing agent is substantially cured at room temperature.

4. The evacuated substrate enclosure of claim 1 further including an evacuation tube operably coupled to the second encapsulation member at the aperture therethrough.

5. The evacuated substrate enclosure of claim 1 wherein the first encapsulation member includes substantially optically transparent material.

6. The evacuated substrate enclosure of claim 5 wherein the first encapsulation member forms a display faceplate.

7. The evacuated substrate enclosure of claim 1 and further including an electrically conductive path disposed on the surface of one of the first and second encapsulation members and traversing the region of the vacuum seal.

8. The evacuated substrate enclosure of claim 7 and further including an electrically conductive interconnect operably coupled to the electrically conductive path.

9. An evacuated substrate enclosure comprising:
   a substrate, having first and second major surfaces and defining an aperture therebetween;
   a plate;
   a sidewall having first and second substantially parallel surfaces, the sidewall being disposed between one of the first and second surfaces of the substrate and the plate to define an encapsulated region therebetween;
   an encapsulation member proximally disposed with respect to the other of the first and second surfaces of the substrate, the encapsulation member defining an aperture therethrough and the encapsulation member and substrate defining an encapsulated region therebetween; and
   a sealing agent disposed in interfaces between the plate and the sidewall, between the sidewall and the substrate and between the encapsulation member and the substrate to effect a vacuum seal at the interfaces such that when the defined encapsulated areas are evacuated the encapsulated areas will be at substantially the same vacuum levels to provide for substantially no differential pressure induced deformation of the substrate.

10. The evacuated substrate enclosure of claim 9 wherein the sealing agent includes an epoxy material that provides a vacuum seal at vacuum pressures of less than $1 \times 10^{-7}$ Torr.

11. The evacuated substrate enclosure of claim 9 wherein the sealing agent is substantially cured at room temperature.

12. The evacuated substrate enclosure of claim 9 further including an evacuation tube operably coupled to the encapsulation member at the aperture therethrough.

13. The evacuated substrate enclosure of claim 9 wherein the plate includes a substantially optically transparent material.

14. The evacuated substrate enclosure of claim 13 wherein the plate forms a display faceplate.

15. An evacuated substrate enclosure comprising:
   a substrate, having first and second major surfaces and defining an aperture therebetween;
   an encapsulation member defining an aperture therethrough and having a supporting surface, the substrate being disposed on a part of the supporting surface and defining an encapsulated region between the encapsulation member and the substrate;
   a plate;
   a sidewall having first and second substantially parallel surfaces and disposed between the plate and the supporting surface of the encapsulation member to define an encapsulated region therebetween; and
   a sealing agent disposed in interfaces between the plate and the sidewall and between the sidewall and the encapsulation member to effect a vacuum seal at the interfaces such that when the encapsulated regions are evacuated the encapsulated regions will be at substantially the same vacuum levels to substantially eliminate differential pressure induced deformation of the substrate.

16. The evacuated substrate enclosure of claim 15 wherein the sealing agent includes an epoxy material providing a vacuum seal at vacuum pressures of less than $1 \times 10^{-7}$ Torr.

17. The evacuated substrate enclosure of claim 15 wherein the sealing agent is substantially cured at room temperature.

18. The evacuated substrate enclosure of claim 15 and further including an evacuation tube operably coupled to the encapsulation member at the aperture therethrough.

19. The evacuated substrate enclosure of claim 15 wherein the plate includes a substantially optically transparent material.

20. The evacuated substrate enclosure of claim 19 wherein the plate forms a display faceplate.

21. The evacuated substrate enclosure of claim 15 and further including an electrically conductive path disposed on the surface of the encapsulation member and traversing the region of the vacuum seal.

22. The evacuated substrate enclosure of claim 15 and further comprising an electrically conductive interconnect operably coupled to the electrically conductive path.

23. An evacuated substrate enclosure comprising:
   a substrate, having first and second major surfaces, and defining an aperture therebetween;
   a first encapsulation member having a generally circumferentially extending mating surface;
   a second encapsulation member having a generally circumferentially extending mating surface proximally disposed with respect to the mating surface of the first encapsulation member so as to define an encapsulated region between the first and second encapsulation members, the second encapsulation member defining an aperture therethrough and having a ledge formed therein so as to be directed inwardly into the encapsulated region with the substrate being supported thereon; and
   a sealing agent disposed between the mating surface of the first encapsulation member and the mating surface of the second encapsulation member to effect a vacuum seal such that when the encapsulated regions are evacuated the encapsulated regions will be at substantially the same vacuum levels to substantially eliminate differential pressure induced deformation of the substrate.

24. The evacuated substrate enclosure of claim 23 wherein the sealing agent includes an epoxy material providing a vacuum seal at vacuum pressures of less than $1 \times 10^{-7}$ Torr.

25. The evacuated substrate enclosure of claim 23 wherein the sealing agent is substantially cured at room temperature.

26. The evacuated substrate enclosure of claim 23 and further including an evacuation tube operably coupled to the second encapsulation member at the aperture therethrough.

27. The evacuated substrate enclosure of claim 23 wherein the first encapsulation member includes substantially optically transparent material.

28. The evacuated substrate enclosure of claim 27 wherein the first encapsulation member forms a display faceplate.

29. The evacuated substrate enclosure of claim 23 and further including an electrically conductive path disposed on one of the surfaces of the first and second encapsulation members and extending from within the encapsulated region to a region externally thereof and traversing the vacuum seal.

30. The evacuated substrate enclosure of claim 29 and further comprising a first electrically conductive interconnect operably coupled to the electrically conductive path.

31. An evacuated substrate enclosure comprising:
a substrate;
a first encapsulation member defining a cavity with a generally circumferentially mating surface extending therearound;
a second encapsulation member defining a cavity with a generally circumferentially mating surface extending therearound and proximally disposed with respect to the mating surface of the first encapsulation member so as to define an encapsulated region between the first and second encapsulation members,
means, within one of the first and second encapsulation members, receiving the substrate for fixedly supporting the substrate and defining a communicating passage between the cavities of the first and second encapsulation members within the encapsulated region; and
a sealing agent disposed between the mating surfaces of the first and second encapsulation members to effect a vacuum seal such that when the encapsulated region is evacuated it will be at substantially the same vacuum levels throughout to substantially eliminate differential pressure induced deformation of the substrate.

32. The evacuated substrate enclosure of claim 31 wherein the means receiving the substrate include a ledge formed within the cavity of the second encapsulation member so as to be directed inwardly into the encapsulated region with the substrate being supported thereon, the ledge further defining a communicating passage between the cavities of the first and second encapsulation members within the encapsulated region.

33. The evacuated substrate enclosure of claim 32 wherein the communicating passage is a notch formed in the ledge.

34. The evacuated substrate enclosure of claim 31 wherein the sealing agent includes an epoxy material providing a vacuum seal at vacuum pressures of less than $1 \times 10^{-7}$ Torr.

35. The evacuated substrate enclosure of claim 31 wherein the sealing agent is substantially cured at room temperature.

36. The evacuated substrate enclosure of claim 31 wherein the second encapsulation member is further formed to define an aperture therethrough and further including an evacuation tube operably coupled to the aperture in the second encapsulation member.

37. The evacuated substrate enclosure of claim 31 further including a first electrically conductive path disposed on the circumferential surface of one of the first and second encapsulation members and extending from within the encapsulated region to a region externally thereof and traversing the vacuum seal.

38. The evacuated substrate enclosure of claim 37 further comprising a first electrically conductive interconnect operably coupled to the electrically conductive path.

39. The evacuated substrate enclosure of claim 31 wherein the first encapsulation member includes a plate and a sidewall having a first surface forming the generally circumferentially mating surface and a second surface formed to mate with the plate, with the plate being positioned proximally to the second surface of the sidewall and the sealing agent being further disposed between the surfaces of the plate and sidewall to effect a vacuum seal when the encapsulated region is evacuated.

40. The evacuated substrate enclosure of claim 39 wherein the plate includes a substantially optically transparent material.

41. The evacuated substrate enclosure of claim 40 wherein the plate forms a display faceplate.

* * * * *